(12) United States Patent
Kemper et al.

(10) Patent No.: US 9,213,246 B2
(45) Date of Patent: Dec. 15, 2015

(54) FLUID EXTRACTION SYSTEM, LITHOGRAPHIC APPARATUS AND DEVICE MANUFACTURING METHOD

(71) Applicant: ASML NETHERLANDS B.V., Veldhoven (NL)

(72) Inventors: Nicolaas Rudolf Kemper, Eindhoven (NL); Robertus Nicodemus Jacobus Van Ballegoij, Eindhoven (NL); Marcus Martinus Petrus Adrianus Vermeulen, Leende (NL); Michel Riepen, Veldhoven (NL); Martinus Wilhelmus Van Den Heuvel, Best (NL); Paul Petrus Joannes Berkvens, Veldhoven (NL); Christophe De Metsenaere, Eindhoven (NL); Jimmy Matheus Wilhelmus Van De Winkel, Kessel (NL); Cornelius Maria Rops, Waalre (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/179,276

(22) Filed: Feb. 12, 2014

(65) Prior Publication Data

US 2014/0300879 A1    Oct. 9, 2014

Related U.S. Application Data

(63) Continuation of application No. 12/634,242, filed on Dec. 9, 2009, now Pat. No. 8,654,309.

(60) Provisional application No. 61/193,639, filed on Dec. 11, 2008.

(51) Int. Cl.
*G03F 7/20* (2006.01)
*F01N 1/02* (2006.01)

(52) U.S. Cl.
CPC ............ *G03F 7/70341* (2013.01); *F01N 1/023* (2013.01); *G03F 7/709* (2013.01)

(58) Field of Classification Search
CPC ...... F01N 1/023; G03F 7/70341; G03F 7/709
USPC ................................................ 138/30; 355/30
See application file for complete search history.

(56) References Cited

U.S. PATENT DOCUMENTS

| 3,931,834 A | * | 1/1976 | Caillet ........................... 138/30 |
| 4,509,852 A | | 4/1985 | Tabarelli et al. |

(Continued)

FOREIGN PATENT DOCUMENTS

| CN | 1825208 | 8/2006 |
| CN | 101140426 | 3/2008 |

(Continued)

OTHER PUBLICATIONS

Taiwan Office Action dated Feb. 22, 2013 in corresponding Taiwan Patent Application No. 098142357.

(Continued)

*Primary Examiner* — Steven H Whitesell Gordon
(74) *Attorney, Agent, or Firm* — Pillsbury Winthrop Shaw Pittman LLP

(57) ABSTRACT

An immersion lithographic apparatus typically includes a fluid handling system. The fluid handling system generally has a two-phase fluid extraction system configured to remove a mixture of gas and liquid from a given location. Because the extraction fluid comprises two phases, the pressure in the extraction system can vary. This pressure variation can be passed through the immersion liquid and cause inaccuracy in the exposure. To reduce the pressure fluctuation in the extraction system, a buffer chamber may be used. This buffer chamber may be connected to the fluid extraction system in order to provide a volume of gas which reduces pressure fluctuation. Alternatively or additionally, a flexible wall may be provided somewhere in the fluid extraction system. The flexible wall may change shape in response to a pressure change in the fluid extraction system. By changing shape, the flexible wall can help to reduce, or eliminate, the pressure fluctuation.

20 Claims, 5 Drawing Sheets

(56) References Cited

U.S. PATENT DOCUMENTS

| | | |
|---|---|---|
| 6,002,987 A | 12/1999 | Kamiya et al. |
| 6,897,599 B2 | 5/2005 | Sorg et al. |
| 7,446,850 B2 | 11/2008 | Hultermans et al. |
| 7,826,030 B2 | 11/2010 | Mulkens |
| 8,018,573 B2 | 9/2011 | Stavenga et al. |
| 8,220,267 B1 | 7/2012 | Stein et al. |
| 8,243,258 B2 | 8/2012 | Butler et al. |
| 2004/0136494 A1 | 7/2004 | Lof et al. |
| 2004/0207824 A1 | 10/2004 | Lof et al. |
| 2005/0282405 A1 | 12/2005 | Harpham et al. |
| 2006/0038968 A1* | 2/2006 | Kemper et al. ............... 355/18 |
| 2006/0082746 A1 | 4/2006 | Mertens et al. |
| 2006/0119809 A1 | 6/2006 | Verhagen et al. |
| 2006/0119813 A1 | 6/2006 | Hultermans et al. |
| 2006/0126040 A1 | 6/2006 | Butler et al. |
| 2006/0139614 A1 | 6/2006 | Owa et al. |
| 2006/0152697 A1 | 7/2006 | Poon et al. |
| 2006/0176456 A1 | 8/2006 | Nagasaka et al. |
| 2006/0187427 A1 | 8/2006 | Stavenga et al. |
| 2007/0139628 A1 | 6/2007 | Nagasaka et al. |
| 2007/0242245 A1 | 10/2007 | Wijckmans et al. |
| 2008/0062393 A1 | 3/2008 | Mulkens |
| 2008/0212046 A1 | 9/2008 | Riepen et al. |
| 2008/0231650 A1 | 9/2008 | Kojima et al. |
| 2009/0040481 A1 | 2/2009 | Nishikawara |
| 2009/0161085 A1 | 6/2009 | Butler et al. |
| 2009/0271129 A1 | 10/2009 | Monmont et al. |
| 2010/0097585 A1 | 4/2010 | Poon et al. |

FOREIGN PATENT DOCUMENTS

| | | |
|---|---|---|
| EP | 1 420 300 | 5/2004 |
| JP | 07-076105 | 3/1995 |
| JP | 2006-165587 | 6/2006 |
| JP | 2006-237608 | 9/2006 |
| JP | 2007-242732 | 9/2007 |
| JP | 2007-281462 | 10/2007 |
| JP | 2008-503079 | 1/2008 |
| JP | 2008-140957 | 6/2008 |
| JP | 2008-140959 | 6/2008 |
| JP | 2008-230137 | 10/2008 |
| TW | 200615039 | 5/2006 |
| WO | 99/49504 | 9/1999 |
| WO | 2005/064405 | 7/2005 |

OTHER PUBLICATIONS

Japanese Office Action mailed Nov. 17, 2011 in corresponding Japanese Patent Application No. 2009-277243.

* cited by examiner

FLUID EXTRACTION SYSTEM, LITHOGRAPHIC APPARATUS AND DEVICE MANUFACTURING METHOD

This application is continuation of co-pending U.S. patent application Ser. No. 12/634,242, filed Dec. 9, 2009, which application claims priority and benefit under 35 U.S.C. §119 (e) to U.S. Provisional Patent Application No. 61/193,639, entitled "Fluid Extraction System, Lithographic Apparatus and Device Manufacturing Method", filed on Dec. 11, 2008. The content of each of the foregoing applications is incorporated herein in its entirety by reference.

FIELD

The invention relates to a fluid extraction system, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may form a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate W as indicated by arrows, preferably along the direction of movement of the substrate W relative to the final element, and is removed by at least one outlet OUT after having passed under the projection system PS as indicated by arrows. That is, as the substrate W is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate W relative to the final element, though this does not need to be the case. Various orientations and numbers of in- and out-lets positioned around the final element are possible, one example is illustrated in FIG. 3 in which four sets of an inlet IN with an outlet OUT on either side are provided in a regular pattern around the final element.

A further immersion lithography solution with a localized liquid supply system is shown in FIG. 4. Liquid is supplied by two groove inlets IN on either side of the projection system PS as indicated by arrows and is removed by a plurality of discrete outlets OUT arranged radially outwardly of the inlets IN as indicated by arrows. The inlets IN and OUT can be arranged in a plate with a hole in its center and through which the projection beam is projected. Liquid is supplied by one groove inlet IN on one side of the projection system PS and removed by a plurality of discrete outlets OUT on the other side of the projection system PS, causing a flow of a thin film of liquid between the projection system PS and the substrate W. The choice of which combination of inlet IN and outlets OUT to use can depend on the direction of movement of the substrate W (the other combination of inlet IN and outlets OUT being inactive).

In European patent application publication no. EP 1420300 and United States patent application publication no. US 2004-0136494, the idea of a twin or dual stage immersion lithography apparatus is disclosed. Such an apparatus has two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

A fluid handling system in an immersion lithographic apparatus may comprise a two-phase extraction system. The extraction system may be configured to remove immersion liquid from a position to which it has been supplied. Typically, such an extraction system extracts a mixture of gas and liquid. For example, the gas could be gas from the surrounding atmosphere or a contactless seal (e.g. gas knife) such as that illustrated in FIG. 5. The liquid could be immersion liquid.

SUMMARY

The two-phase extracted flow of a two-phase extraction system may be anisotropic and may have unstable flow characteristics. This can lead to undesirable mechanical effects, such as unwanted vibrations on the substrate and/or substrate table. Imaging errors may result.

It is desirable, for example, to provide a fluid handling system in which vibrations (which may observed as an imaging error) generated by two-phase extraction are reduced or eliminated.

According to an embodiment of the invention, there is provided a fluid extraction system to extract a two-phase fluid in a lithographic apparatus. The fluid extraction system comprises an extraction channel for two-phase fluid flow therethrough. The fluid extraction system also comprises a buffer chamber containing a volume of gas, the buffer chamber fluidly connected to the extraction channel. The fluid extraction system is configured such that liquid is substantially prevented from entering the buffer chamber.

According to an embodiment of the invention, there is provided a method of reducing a pressure fluctuation of an immersion liquid used in an immersion lithographic apparatus. The method comprises extracting a two-phase fluid from a location in the immersion lithographic apparatus using a fluid extraction system. The method also comprises reducing a pressure fluctuation in the two-phase fluid being extracted by using a buffer chamber of the fluid extraction system.

According to an embodiment of the invention, there is provided a fluid extraction system to extract a two-phase fluid in a lithographic apparatus. The fluid extraction system comprises an extraction channel for two-phase fluid flow therethrough. The fluid extraction system also comprises a separation tank fluidly connected to the extraction channel, and configured to receive the two-phase fluid flow from the extraction channel. At least a portion of a wall of the extraction channel and/or at least a portion of a wall of the separation tank comprises a flexible boundary portion configured to deform in response to a change in the pressure differential across it so as to reduce a fluctuation in pressure of the two-phase fluid in the fluid extraction system.

According to an embodiment of the invention, there is provided a method of reducing a pressure fluctuation of an immersion liquid used in an immersion lithographic apparatus. The method comprises extracting a two-phase fluid from a location in the immersion lithographic apparatus using a fluid extraction system. The method also comprises reducing a pressure fluctuation in the two-phase fluid by using a flexible boundary portion of the fluid extraction system, the flexible boundary portion configured to change shape in response to a change in pressure differential across the flexible boundary portion.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figures 1, 1A, 1B:
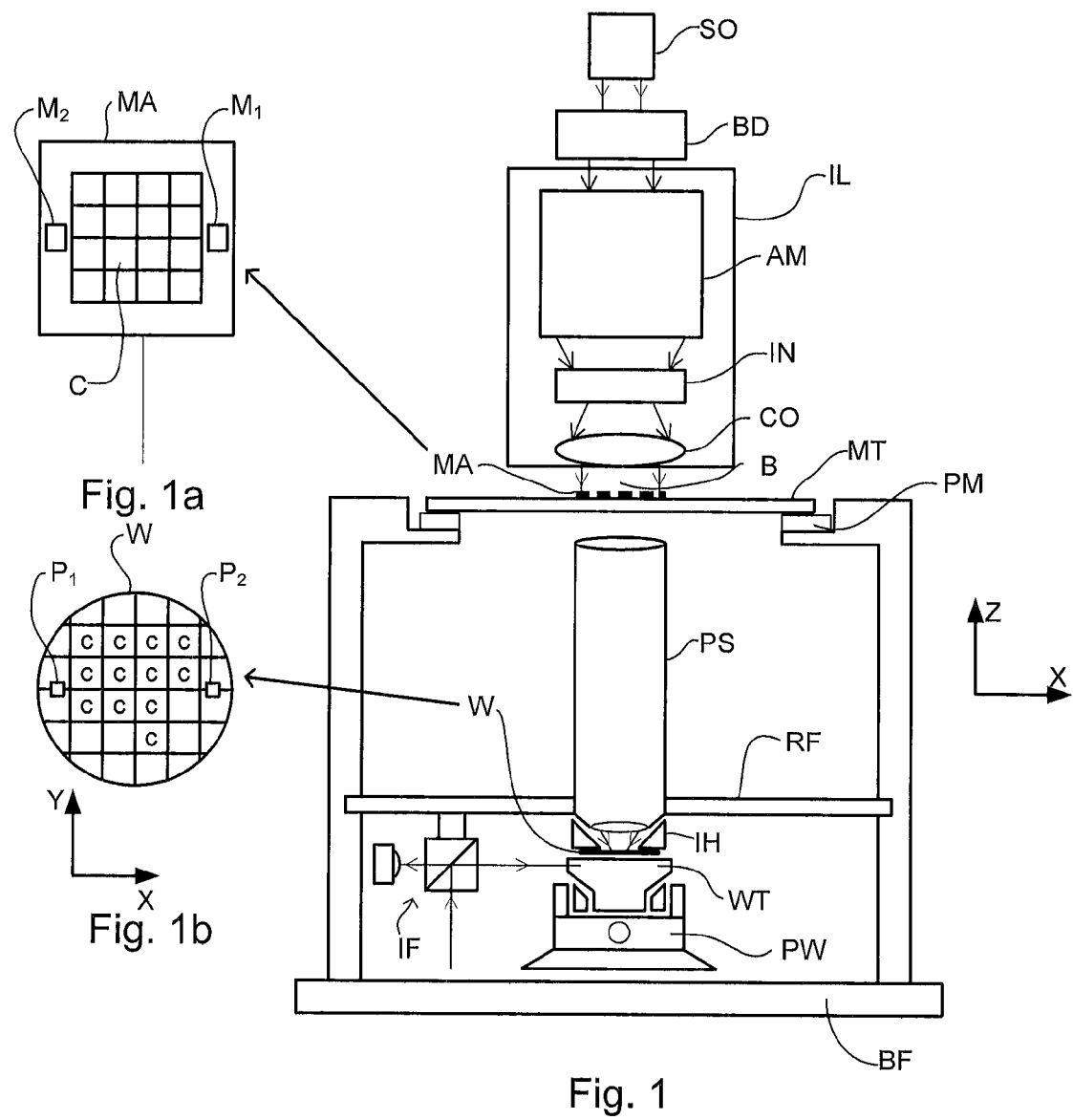
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. It holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may be employed.

Arrangements for providing liquid between a final element of the projection system and the substrate can be classed into at least two general categories. These are the bath type (or submersed) arrangement and the so called localized immersion system. In the submersed arrangement, substantially the whole of the substrate and optionally part of the substrate table is submersed in a liquid, such as in a bath or under a film of liquid. The localized immersion system uses a liquid supply system to provide liquid to only a localized area of the substrate. In the latter category, the space filled by liquid is smaller in plan than the top surface of the substrate. The volume of liquid in the space that covers the substrate remains substantially stationary relative to the projection system while the substrate moves underneath that space.

Figure 2:
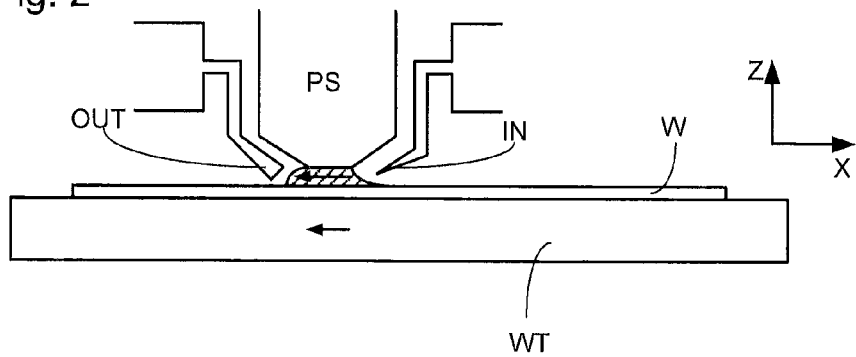
FIGS. 2 and 3 depict a liquid supply system for use in a lithographic projection apparatus.
Figure 3:
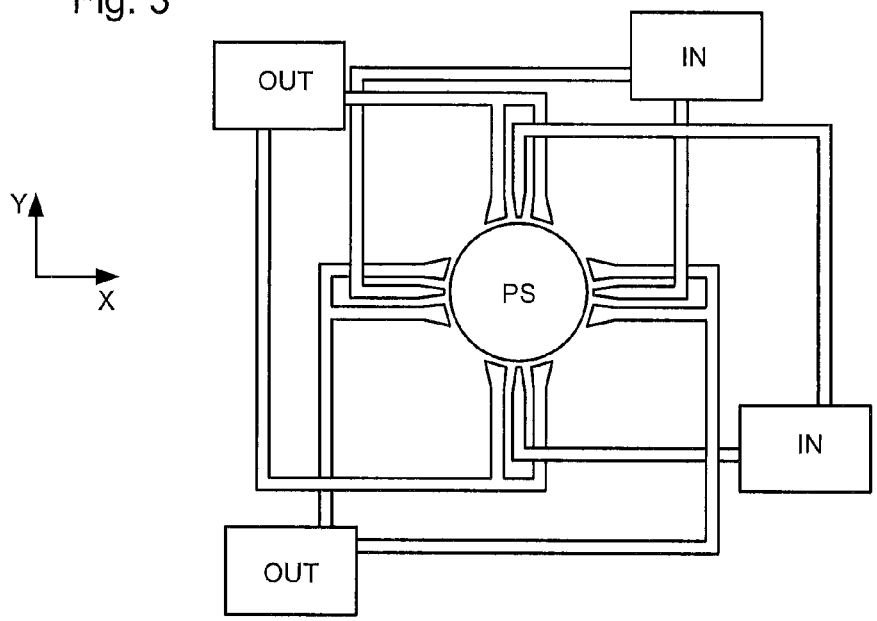
Figure 4:
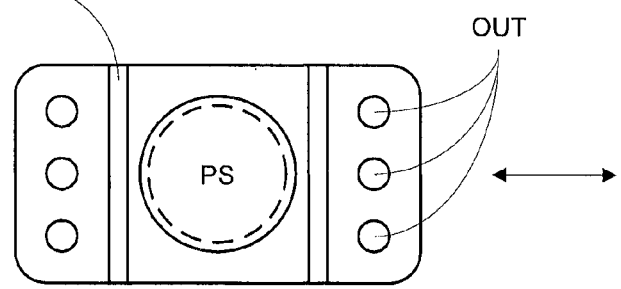
FIG. 4 depicts a liquid supply system for use in a lithographic projection apparatus.
Figure 4:
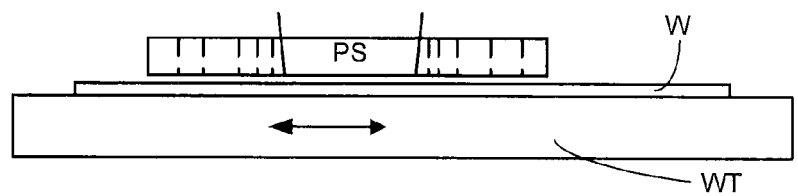

A further arrangement, to which an embodiment of the present invention may be directed, is the all wet solution in which the liquid is unconfined. In this arrangement, substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system. However, sealing features are not present in the liquid supply device, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 are described above.

Figure 5:
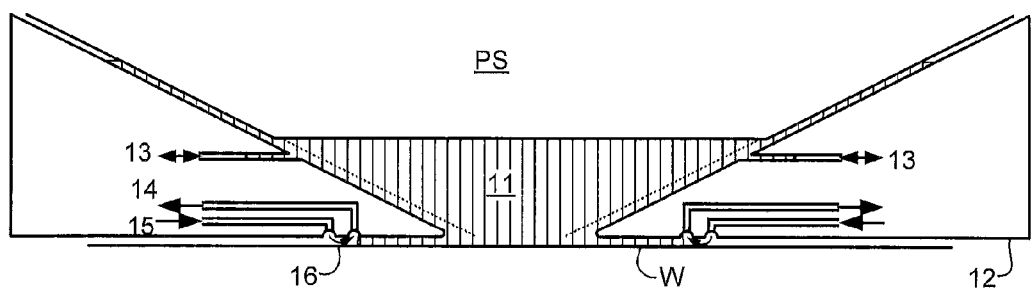
FIG. 5 depicts a liquid supply system for use in a lithographic projection apparatus.

FIG. 5 schematically depicts a localized liquid supply system or fluid handling structure with a barrier member or fluid confinement structure 12, which extends along at least a part of a boundary of the space 11 between the final element of the projection system PS and the substrate table WT or substrate W. (Please note that reference in the following text to surface of the substrate W refers in addition or in the alternative to a surface of the substrate table WT, unless expressly stated otherwise.) The fluid confinement structure 12 is substantially stationary relative to the projection system PS in the XY plane though there may be some relative movement in the Z direction (in the direction of the optical axis). In an embodiment, a seal is formed between the fluid confinement structure 12 and the surface of the substrate W and may be a contactless seal such as a gas seal or fluid seal.

The fluid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the fluid confinement structure 12 positioned below and surrounding the final element of the projection system PS. Liquid is brought into the space 11 below the projection system PS and within the fluid confinement structure 12 by liquid inlet 13. The liquid may be removed by liquid outlet 13. The fluid confinement structure 12 may extend a little above the final element of the projection system PS. The liquid level rises above the final element so that a buffer of liquid is provided. In an embodiment, the fluid confinement structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid is contained in the space 11 by the gas seal 16 which, during use, is formed between the bottom of the fluid confinement structure 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between fluid confinement structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid confinement structure 12 and the substrate W contains the liquid in a space 11. Each opening (i.e. inlet or outlet) may be an annular groove which surrounds the space 11. The annular groove may be continuous or discontinuous. The flow of gas 16 is effective to contain the liquid in the space 11. Such a system is disclosed in United States patent application publication no. US 2004-0207824.

An embodiment of the invention may be applied to a fluid handling structure used in an immersion apparatus. The example of FIG. 5 is a so called localized area arrangement in which liquid is only provided to a localized portion of the top surface of the substrate W at any one time. Other arrangements are possible, including fluid handling systems which make use of a single phase extractor (whether or not it works in two phase mode) as disclosed, for example, in United States patent application publication no US 2006-0038968. In this regard, it will be noted that a single phase extractor can work in two phase mode. In an embodiment, a single phase extractor may comprise an inlet which is covered in a porous material which is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 50 µm. In an embodiment, the porous material is at least slightly liquidphilic (e.g., hydrophilic), i.e. having a contact angle of less than 90° to the immersion liquid, e.g. water. In an embodiment, the liquid handling system may have an opening, such as an outlet, covered with a porous member.

Another arrangement which is possible is one which works on a gas drag principle. The so-called gas drag principle has been described, for example, in United States patent application publication no. US 2008-0212046 and U.S. patent application No. 61/071,621 filed on 8 May 2008. In that system the extraction openings (e.g., holes) are arranged in a shape which desirably has a corner. The corner may be aligned with the stepping and scanning directions. This reduces the force on the meniscus between two openings in the surface of the fluid handing structure for a given relative velocity between the substrate table WT (including the substrate W) and the fluid confinement structure in the step or scan direction compared to if the two outlets were aligned perpendicular to the direction of scan. Desirably the relative velocity may be a velocity range. The openings of a fluid handling structure may have extraction openings which have no covering or have a covering made of a porous material.

An embodiment of the invention can be applied to any system in which a two-phase fluid flow may be extracted. For example, an embodiment of the invention could be applied to a fluid handling structure used in an all wet immersion apparatus. In the all wet embodiment, fluid is allowed to cover substantially the whole of the top surface of the substrate table, for example, by allowing liquid to leak out of a confinement structure which confines liquid to between the final element of projection system and the substrate. An example of a fluid handling structure for an all wet embodiment can be found in U.S. patent application No. 61/136,380 filed on 2 Sep. 2008.

Figure 6:
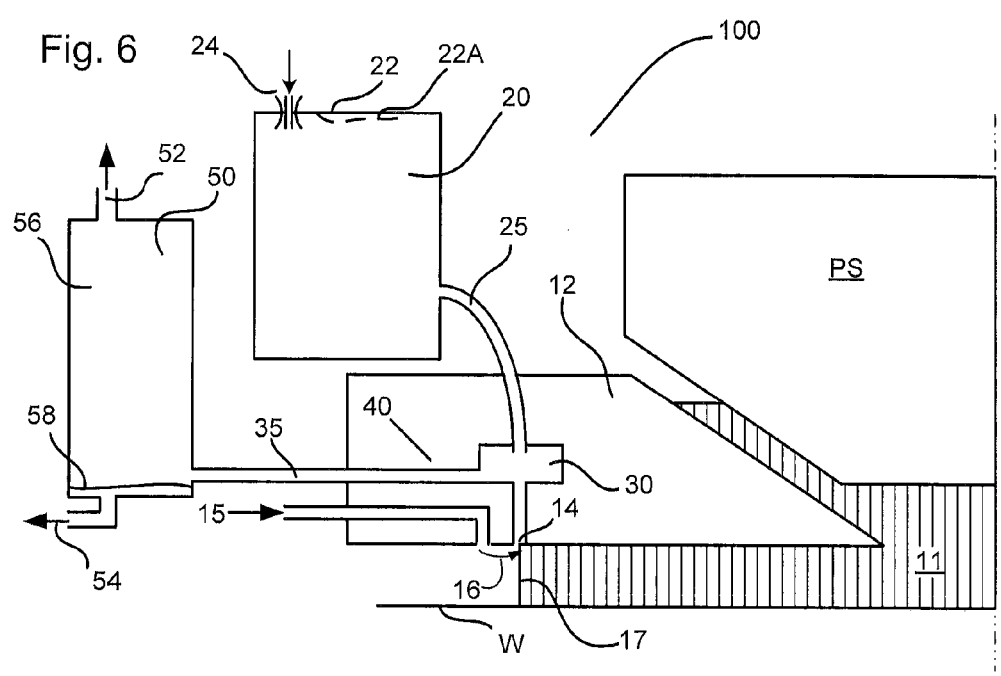
FIG. 6 is a schematic illustration of a fluid handling system comprising a fluid extraction system according to an embodiment of the invention.

FIG. 6 illustrates schematically, in cross-section, a fluid handling system 100 according to an embodiment of the invention. The fluid handling system 100 at least partly confines an immersion liquid to an immersion space 11 between the projection system PS and the substrate W. The fluid handling system 100 can provide liquid to the immersion space 11. However, for simplicity, any openings (i.e. inlets and/or outlets) for allowing the immersion liquid to enter and/or exit the immersion space 11 are not illustrated. The openings may be of any suitable type and configuration for example those described with reference to FIG. 5.

The fluid handling system may be used to supply, confine and/or control a liquid, for example an immersion liquid. However, it will be appreciated that in some examples, a gas may be used in the fluid handling system, for example in a sealing element. Thus, in the embodiments of the invention described herein, the term fluid handling system will be used. However, in some embodiments, the term fluid handling system could be replaced with liquid handling system. In such a liquid handling system gas is not supplied. However, in an embodiment the liquid handling system has an extraction opening which extracts gas and liquid in two phase fluid flow.

As can be seen from FIG. 6, the fluid handling system 100 comprises a gas seal 16 arranged to confine the immersion liquid (shown in FIGS. 5, 6, 8, 9 and 10 as a vertical hatched area) to the immersion space 11. At the boundary between the immersion liquid and the gas, the immersion liquid may have a meniscus 17. The gas seal 16 may be substantially the same as the gas seal 16 described above in relation to FIG. 5. As such, it may have an opening 15 for use as a gas inlet 15 (which may be at an overpressure), and an opening 14 for use as a gas outlet 14 (which may be at an underpressure). In the following description, the opening 15 will be referred to as gas inlet 15 (or inlet 15), and the opening 14 will be referred to as gas outlet 14 (or outlet 14). Any other suitable gas seal may be used.

In an embodiment, a mixture of sealing gas from the gas seal 16 and immersion liquid from the immersion space 11 is extracted through the outlet 14 of the gas seal 16. Thus, a two-phase fluid flow of liquid and gas is extracted through the outlet 14.

Having been extracted through the outlet 14, the two-phase fluid flows into and through an extraction channel 40 which is connected to the outlet 14. The extraction channel 40 may comprise an extraction chamber 30 into which the extracted two-phase fluid flow can enter. The extraction chamber 30 may be located inside the confinement structure 12. The extraction channel 40 may comprise an extraction duct, or passageway, 35. The extraction channel 40 may be at least partially located inside the confinement structure 12. The extraction channel 40 may be at least partially located outside the fluid confinement structure 12.

The extracted two-phase fluid flow flows along the extraction channel 40 due to an underpressure being applied to the exit of the extraction channel 40. At the exit of the extraction channel 40, the two-phase fluid is supplied into a settling chamber 50, such as a separation tank. As such, the settling chamber 50 is configured to receive the extracted two-phase fluid from the extraction channel 40. Inside the settling chamber 50, the two-phase fluid mixture separates. Thus, the liquid 58 settles to the bottom of the settling chamber 50, and may be extracted through an opening, e.g. exit 54 (for example by using a liquid extraction pump). The gas 56 may then be removed from the settling chamber 50 through a different exit 52. The different exit 52 may, for example, be an opening at the top of the settling chamber 50, or an opening defined in the settling chamber 50 at least at a higher position than the liquid exit 54. A pump (not illustrated) may be attached to the gas exit 52. This pump may be used to generate a regulated underpressure (or regulated vacuum) in the settling chamber 50. This underpressure generated by the pump may act throughout the extraction system. So the pump may generate an underpressure in the settling chamber 50, along the extraction channel 40 (including optionally in the extraction passageway 35 and extraction chamber 30) and at the gas seal outlet 14. The pump that may be attached to the gas exit 52 of the settling chamber 50 may be used to generate the underpressure for extracting the flow through gas seal outlet 14.

The pump used to generate the underpressure for the gas exit 14 of the gas seal 16 may be located at any suitable position, for example at any point along the extraction channel 40. For example, alternatively or additionally it may not be necessary to have a settling chamber 50. The pump would be located at a position other than at the exit to a settling chamber 50. For example, the pump could be located at an opening in the extraction channel or adjacent to the gas seal outlet 14. Please note that reference in this paragraph to the location of the pump includes reference to a connection to the pump.

In a conventional fluid extraction system, a two-phase fluid flow (for example, of sealing gas used for the gas seal 16 and the immersion liquid in the immersion space 11) is extracted through gas seal outlet 14 and along the extraction channel 40. Because the flow is two-phase, the pressure acting in the fluid extraction system (i.e. including at the gas seal outlet 14) can vary. This may be because the two phase fluid flow is unstable. Some two phase fluid flow types may be stable and exhibit smooth flow. In such two phase fluid flow regimes the proportion of liquid in the fluid flow may be small, or the two phases flow separately, e.g. co-axially. Vibrations tend not to be caused by such smooth flow regimes. However, in an unstable two phase fluid flow regime, such as slug flow, the liquid may occasionally (such as in an oscillating, repetitive manner) or continuously block the conduit through which the two phase fluid flows. Such behavior causes a pressure fluctuation in the two phase fluid flow. For example, the pressure acting due to the pump attached to the gas exit 52 in the fluid extraction system can vary with the proportion of gas to liquid that is currently being extracted through gas seal outlet 14, and/or the proportion of gas to liquid that is currently in the extraction channel 40.

The pressure fluctuation, for example, in the two phase fluid flow can be transmitted (for example, via the gas seal outlet 14) to the immersion liquid and/or the gas between the gas seal outlet 14 and the substrate W and/or substrate table WT. These pressure fluctuations can thus result in forces being transmitted through the immersion liquid confined in the immersion space 11 and/or through the gas to the substrate W or the substrate table WT. Thus, unwanted motion and/or acceleration of the substrate W and/or the substrate table WT can result. Such unwanted movement could be in, for example, the z axis (the optical axis of the projection system PS), or the x and/or y axes (in the plane of the substrate surface). This motion may be transferred to the substrate table WT by the fluid between the confinement structure 12 and the substrate table WT. Unwanted motion and/or acceleration of the substrate W, substrate table WT, or both, relative to the projection system PS can lead to inaccuracies (for example focus and overlay errors) in the exposure.

The aforementioned paragraph refers to application of the forces directly from the two phase fluid flow through intermediate fluid. However, the pressure fluctuations may be transmitted to the substrate W and/or substrate table WT by another path, by interaction between the confinement structure 12 and the substrate table WT. This interaction may be determined by the relative stiffness and damping properties of the substrate table WT and the confinement structure 12. For example, a pressure fluctuation may cause motion of the confinement structure 12, or one or more of its components. Such motion may be relative to the substrate table WT. The forces causing the motion, or at least some of the forces, may be transferred to the substrate table WT by the fluid between the confinement structure 12 and the substrate table WT (i.e. the immersion liquid as a liquid is incompressible), and cause unwanted motion and/or acceleration of the substrate W and/or substrate table WT.

In order to reduce the pressure fluctuation in the two-phase fluid flow that is extracted from gas seal outlet 14, a buffer chamber 20 is provided as shown in FIG. 6. The buffer chamber 20 defines a buffer volume. As shown in FIG. 6, the buffer chamber 20 is attached to the extraction chamber 30 via a connection pipe 25 or conduit. The buffer volume is thus fluidly in communication with the extracted two-phase fluid (i.e. two-phase extraction system). In an embodiment, the buffer chamber 20 may be fluidly attached to another part of the fluid extraction system via a suitable connection conduit. For example, the buffer chamber 20 could be attached to another part of the extraction channel 40, such as the extraction passageway 35. As shown in FIG. 6, the buffer chamber 20 may be located separately from other components of the apparatus. However, it may be possible to incorporate the buffer chamber 20 into one or more other parts of the lithographic apparatus. For example, it may be possible to incorporate (or locate) the buffer chamber 20 into the confinement structure 12, or into the projection system PS. The buffer chamber 20 may be provided as part of the extraction chamber 30.

The buffer chamber 20 (which may be referred to as an expansion vessel 20) can reduce the pressure fluctuation in the two-phase extraction system. For example the volume of gas contained in the buffer chamber 20 may help to absorb a fluctuation present in the extraction system. The fluctuation may be created in and/or transmitted through the extraction system. Such a fluctuation which is absorbed in the buffer chamber 20 may include a pressure fluctuation that would otherwise be present in the extraction channel 40, extraction chamber 30, the extraction passageway 35, and/or at the gas seal outlet 14. It is desirable for the buffer chamber 20 to be sufficiently large to absorb such a pressure fluctuation, desirably substantially completely. In an embodiment the volume of gas in the buffer chamber 20 would be between from two times to five times as large as the total volume of the rest of the fluid extraction system (i.e. the whole of the extraction channel 40 (which may comprise the extraction chamber 30) but not including the settling chamber 50). Desirably, the volume of gas in the buffer chamber 20 would be in the range of from three times to four times as large as the total volume of the rest of the fluid extraction system. The buffer chamber 20 may be four times as large as the total volume of the rest of the fluid extraction system. The shape of the buffer chamber 20 may not be important. Thus, the shape of the buffer chamber 20 could be any shape, for example, be a cube, a cuboid, a rhomboid, or a sphere.

As explained above, the buffer chamber 20 is arranged to be connected to the two-phase fluid flow via a connection pipe 25. However, the buffer chamber 20 is arranged to be separate from the main extraction flow path for the gas and/or the liquid in the two phase fluid flow. That is, the buffer chamber 20 is arranged so as not to be part of the main extraction flow path. As such, the volume of gas in the buffer chamber 20 is substantially static i.e. the flow rate in the buffer chamber 20 is substantially zero. At least 70%, desirably 90%, more desirably substantially all of the fluid (including the gas) in the two phase fluid flow passes through the extraction channel, for example, downstream of the buffer chamber. Thus, substantially no gas is extracted from the extraction system through the buffer chamber.

In an embodiment, the buffer chamber 20 is a dry volume. As such, the buffer chamber 20 may contain fluid in a single phase, i.e. gas. Desirably, the buffer chamber contains no liquid. Containing gas but no liquid can help the buffer chamber 20 to absorb a pressure fluctuation more effectively. The extraction system may be arranged such that substantially no liquid (for example from the two phase fluid flow) can enter the buffer chamber 20. In order to help ensure that substantially no liquid enters the buffer chamber 20, a purge flow 24 may be applied. This purge flow 24 may be an inflow of gas which acts to prevent liquid entering the buffer chamber 20 through the connecting pipe 25 which connects the buffer chamber 20 to the fluid extraction system. The purge flow 24 is optional, and may not be required in some embodiments.

In FIG. 6, the buffer chamber 20 is shown as being an enclosed volume with rigid walls. However, some embodiments may comprise modifications of this arrangement. For example, in some embodiments there may be an opening in at least one of the walls of the buffer chamber 20 that is open to the atmosphere. The opening would be relatively small. For example, the opening could be between from 0.1 mm$^2$ and 10 mm$^2$. Desirably, the opening could be between from 0.5 mm$^2$ and 5 mm$^2$. Desirably, the opening could be approximately 1 mm$^2$. Such an opening to the atmosphere could additionally or alternatively be provided to a boundary of the extraction channel 40, for example in the extraction passageway 35 and/or the extraction chamber 30.

Alternatively or additionally, at least one of the walls of the buffer chamber 20 may be flexible. For example, wall 22 as shown in FIG. 6 may be constructed from a flexible material (for example, a suitable polymer) that can elastically deform as a result of a pressure change across it. The wall may comprise a flexible component, which may be resilient. In FIG. 6, this flexible wall (or flexible boundary portion) is shown as dashed line 22A. The flexible wall can further help to reduce a pressure fluctuation in the fluid extraction system.

Figure 7:
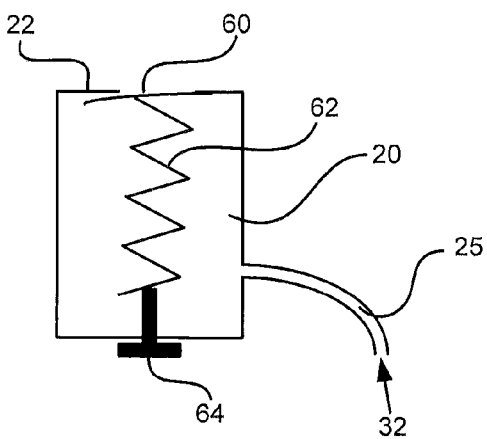
FIG. 7 is a schematic illustration of a buffer chamber for use with a fluid handling system comprising a fluid extraction system according to an embodiment of the invention.

FIG. 7 shows, in cross-section, a modified buffer chamber 20. This buffer chamber 20 includes a flap 60 attached to a wall 22 of the buffer chamber 20. The flap 60 may operate as a valve and it may be in the form of a plate or sheet. When closed, the flap 60 seals the buffer chamber 20 so as to form an enclosed volume. When open, the flap 60 allows a path fluidly to connect the environment to the buffer chamber 20. When the pressure in the buffer chamber 20 reduces below a certain level (for example due to a pressure fluctuation in the fluid extraction system), the flap 60 may open. This opening of the valve, i.e. flap 60, may allow higher pressure gas (e.g. environmental air) to enter the buffer chamber 20. This can help to increase the pressure in the buffer chamber 20, thereby further reducing the pressure fluctuation 32 in the fluid extraction system.

In order to bias the flap 60 to the closed position, a biasing member 62 may be provided. For example, the biasing member 62 may be resilient, and may be a spring. The pressure difference either side of the flap 60 to overcome the biasing member 62 may be adjusted by an adjusting member 64. For example, the adjusting member 64 may be a screw. The screw may be configured to adjust the compression of the biasing member 62 (or the compressive force provided by the biasing member 62).

Although the flap 60 is shown in FIG. 7 as being applied to the buffer chamber 20, it will be understood that such a flap 60 could be incorporated into the fluid extraction system at any suitable location. For example, a flap 60 could be provided on the fluid extraction channel 40 (for example, the extraction chamber 30 and/or the extraction passageway 35) directly.

Figure 8:
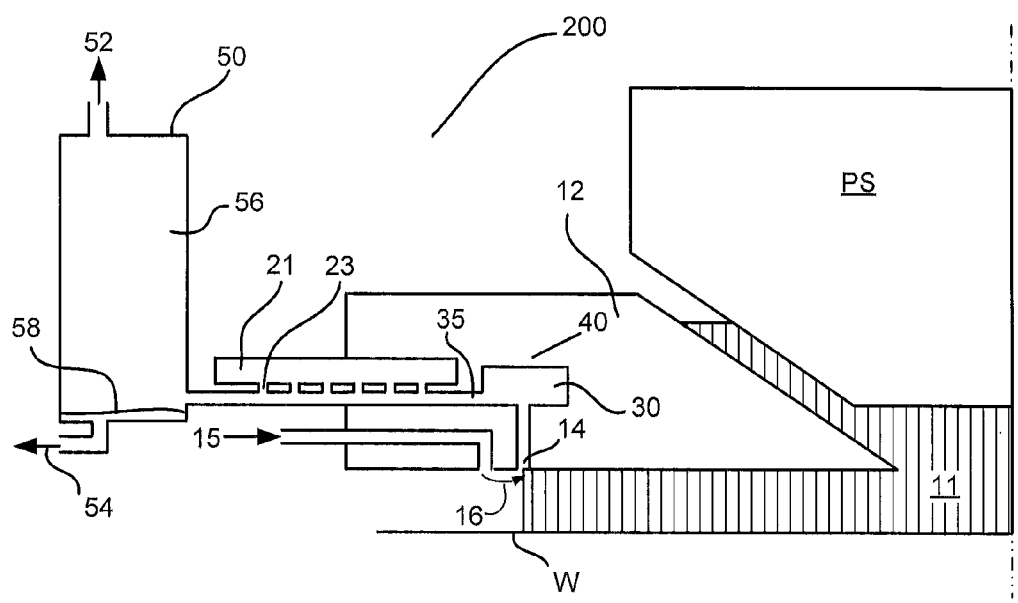
FIG. 8 is a schematic illustration of a fluid handling system comprising a fluid extraction system according to an embodiment of the invention.

FIG. 8 shows an embodiment of the invention in which the buffer chamber 20 comprises a buffer channel (or pipe) 21. The buffer channel 21 runs substantially parallel to the extraction channel 40 (in particular substantially parallel to the extraction passageway 35). As shown in FIG. 8, the buffer channel 21 may be connected to the extraction channel 40 via at least one interconnection 23. The buffer pipe 21 is shown in FIG. 8 as being partially inside the confinement structure 12 and partially outside the confinement structure 12. In an embodiment, the buffer channel 21 could be located entirely within the fluid confinement structure 12. The buffer channel 21 could be located entirely outside the fluid confinement structure 12.

The purpose of the buffer channel 21 is substantially the same as the purpose of the buffer chamber 20 of the FIG. 6 embodiment. The buffer channel 21 acts to reduce the pressure fluctuation in the fluid extraction system. The buffer channel 21 helps to reduce the disturbances experienced by the substrate W and/or substrate table WT. The buffer channel 21 provides an elastic volume of gas which may act to reduce pressure fluctuation in the fluid handling system 200.

Any of the arrangements and/or modifications to the buffer chamber 20 of an embodiment as shown in FIG. 6 may be applied to the buffer channel 21 of the embodiment of the fluid handling system 200 shown in FIG. 8. Any one or more of the following features (provided in a non-limiting list) may be applied to the buffer channel 21: a purge flow 24, a flexible wall, a flap 60, and/or an opening to the atmosphere.

Figure 9:
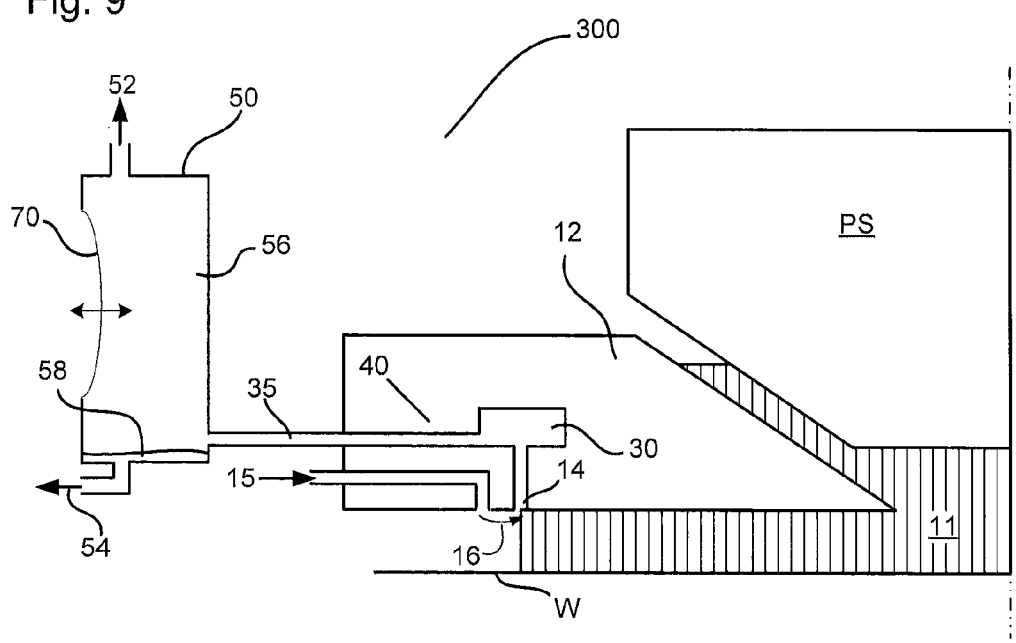
FIG. 9 is a schematic illustration of a fluid handling system comprising a fluid extraction system according to an embodiment of the invention.

FIG. 9 shows a fluid handling system 300 according to an embodiment of the invention. In FIG. 9 is shown the extraction of a two-phase fluid through an exit (or opening) 14 of the gas seal 16 as shown in FIGS. 6 and 8. In FIG. 9, the two-phase fluid flows along the extraction channel 40 (which may or may not include an extraction chamber 30 and/or an extraction passageway 35) and into a separation chamber 50. As described above in relation to other embodiments, the two-phase fluid separates into its two constituent phases in the settling chamber 50, namely a gaseous phase 56 and a liquid phase 58. The liquid phase 58 may be extracted from the fluid settling chamber 50 via an opening (i.e. a fluid outlet) 54. The separated gas may be extracted from the fluid settling chamber 50 via a different opening (i.e. a gas exit) 52.

In the embodiment shown in FIG. 9, at least a part of the boundary of the settling chamber 50 is flexible. For example, at least one wall, or at least a part of at least one wall, of the settling chamber 50 may be made from a flexible material, so as to form a flexible boundary portion 70. The flexible boundary portion may be resilient. Desirably, the flexible boundary portion 70 can elastically deform. For example, the flexible boundary portion 70 may elastically deform due to a change in a pressure differential applied across it. The flexible boundary portion 70 may be, for example, a flexible membrane. The boundary portion 70 may be made from a suitable material, for example a material which can elastically deform, for example an appropriate polymer material.

In operation, as the pressure in the fluid extraction system varies (for the reasons explained above), the shape of the flexible boundary portion 70 may change due to a change in pressure difference across it. In this way, the shape and size of the separation chamber 50 can change in response to the pressure inside the settling chamber 50. Any pressure fluctuation in the fluid extraction system (including the extraction channel 40 and at the gas seal outlet 14) can be reduced, and desirably eliminated.

In FIG. 9, the flexible boundary portion 70 is shown as being provided to the settling chamber 50. Additionally or alternatively, a flexible boundary portion 70 may be present on any other portion of the fluid extraction system, for example as part of any component of the fluid extraction system. For example, a flexible boundary portion 70 may be provided to at least a portion of the extraction channel 40, for example the extraction passageway 35 and/or the extraction chamber 30.

In an embodiment, as shown in FIG. 9, there is no buffer chamber 20 or buffer channel 21. However, in an embodiment a buffer chamber 20 and/or a buffer channel 21 may be present in addition to the features present in the apparatus shown in FIG. 9.

As such, the features shown and described with reference to any of the FIGS. 6, 7, 8 and/or 9 (including optional features relating thereto) alone or in combination, may be combined. Thus, an apparatus having a flexible boundary portion 70 as shown in FIG. 9 may include a buffer chamber 20 (as described above in relation to FIG. 6), and/or a buffer channel 21 (as described above in relation to FIG. 8). Furthermore, as mentioned above, a flexible boundary portion may additionally or alternatively be provided to the buffer chamber 20 and/or the buffer channel 21.

Figure 10:
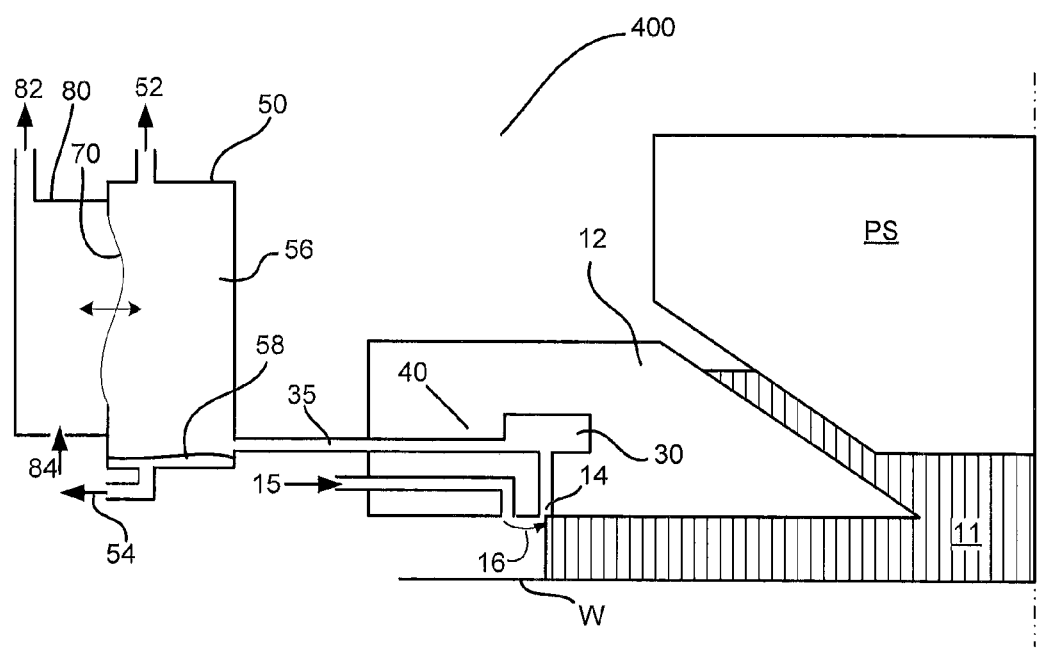
FIG. 10 is a schematic illustration of a fluid handling system comprising a fluid extraction system according to an embodiment of the invention.

In FIG. 9, the side of the flexible boundary portion 70 that faces away from the separation chamber 50 may be open to atmospheric pressure. However, in an embodiment of a fluid handling system 400, as shown in FIG. 10, the side of the flexible boundary portion 70 that faces away from the settling chamber 50 may form part of the boundary of a secondary chamber 80, or a pressure control chamber 80.

The pressure control chamber 80 is provided adjacent the separation chamber 50. The pressure control chamber 80 has at least a part of its boundary formed by the flexible boundary portion 70 that forms at least a part of the boundary of the separation chamber 50. A side of the flexible boundary portion 70 is exposed to the pressure in the separation chamber 50 (which is related to the pressure in the extraction channel 40 and at the gas seal outlet 14, as described above). The other side of the flexible boundary portion is exposed to the pressure in the pressure control chamber 80.

The pressure in the pressure control chamber 80 can be regulated to be different from atmospheric pressure, for example to be lower than atmospheric pressure. This can be achieved in the following way. The pressure control chamber may have an opening 84 for inlet of gas, and an opening 82 for outlet of gas. The pressure in the pressure control chamber 80 can be reduced below atmospheric pressure, for example, by using an extraction pump at the exit 82 of the pressure control chamber 80. Lowering the pressure inside the pressure control chamber 80 causes the pressure differential across the flexible boundary portion 70 to reduce in comparison to the arrangement in which the pressure control chamber 80 is absent as shown in FIG. 9. That is, in comparison to the arrangement in which the outside face of the flexible boundary portion 70 is exposed to atmospheric pressure. The pressure inside the pressure control chamber 80 could be set to be approximately the same as the pressure inside the separation chamber 50. Reducing the pressure differential across the flexible boundary portion 70 is desirable because it can improve the response of the flexible boundary portion 70 to a change in pressure inside the settling chamber 50 (i.e. to a change in pressure of the two-phase fluid being extracted). For example, providing the pressure control chamber 80 can mean that the flexible boundary portion 70 is responsive to a smaller change in pressure in the settling chamber 50 and/or responds more quickly to a given pressure change in the settling chamber 50.

As described above, the flexible boundary portion 70 may be provided to any suitable part of the fluid extraction system, for example on the extraction channel 40 and/or on the buffer chamber 20 and/or the buffer channel 21. A pressure control chamber 80 as described above in relation to FIG. 10 may be provided to any part of the extraction system that has a flexible boundary portion 70. As such, the pressure on the side of the flexible boundary portion 70 that is not exposed to a part of the fluid extraction system can be controlled using a pressure control chamber 80 (which may be referred to as a pressure control tank), wherever the flexible boundary portion 70 is located.

Embodiments of the invention have been described herein with reference to two-phase extraction from a gas seal. However, an embodiment of the invention may be applied to any apparatus involving a two-phase fluid extraction of gas and liquid. In particular, an embodiment of the invention may be applied to any part of a lithographic apparatus (for example an immersion lithographic apparatus) in which two-phase fluid extraction is performed. As described above, an embodiment of the invention may help to reduce, or eliminate, a pressure fluctuation in a two-phase extraction system. For example, an embodiment of the invention may be applied to any gas seal for preventing immersion liquid from accessing the underside of a substrate when positioned on a substrate table (which may be known as a wafer edge seal, or WES). Additionally or alternatively, an embodiment of the invention may be applied to a two-phase extraction system used to extract fluid from between a substrate and a substrate table (which may be known as a bubble extraction system, or BES). Additionally or alternatively, an embodiment of the invention may be applied to a two-phase extraction system used to extract fluid from a system used during substrate swap, when changing the table underneath the projection system PS and the fluid handling structure 12. In such an arrangement, the two phase extraction system would extract liquid in a two phase fluid flow from a gap between a substrate table and a shutter member.

At substrate swap, an exposed substrate is removed from the substrate table WT and a new substrate for exposure is placed in the substrate table. During substrate swap, the shutter member is placed underneath the projection system and the fluid confinement structure 12 so as to keep immersion liquid in the space 11. The shutter member may be: a closing member, such as a closing disc, which is co-planar with the substrate table WT, present in a recess in the substrate table WT and which may be transferred to the new table; another substrate table WT; a measurement table which is configured not to support a substrate; or a swap bridge which acts as a bridge between two tables. Between the surface of the substrate table and the shutter member may be a gap into which liquid may escape from the fluid confinement structure, for example as the gap passes underneath the fluid confinement structure.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase fluid flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In an embodiment there is provided a fluid extraction system to extract a two-phase fluid in a lithographic apparatus. The fluid extraction system comprises: an extraction channel, and a buffer chamber. The extraction channel is for two-phase fluid flow therethrough. The buffer chamber contains a volume of gas. The buffer chamber is fluidly connected to the extraction channel. The fluid extraction system is configured such that liquid is substantially prevented from entering the buffer chamber.

The fluid extraction system may be configured such that substantially no gas is extracted from the fluid extraction system through the buffer chamber. The fluid extraction system may be configured such that at least 70%, desirably 90%, more desirably all of the gas extracted from the extraction system passes through the extraction channel downstream of the buffer chamber. The extraction channel may define a pathway for the flow of the two-phase fluid.

The extraction channel may comprise an extraction chamber through which the pathway passes. The extraction chamber may be located in a barrier member of the fluid extraction system. The buffer chamber may be fluidly connected to the extraction chamber via a connection conduit that is separate from the extraction channel. The extraction channel may comprise an extraction passageway. The extraction passageway may be downstream of the extraction chamber. The extraction passageway may be configured to allow the two-phase fluid to flow there along. The extraction channel may comprise an extraction passageway, downstream of the extraction chamber, along which, in use, the two-phase fluid flows. The buffer chamber may be fluidly connected to the extraction passageway via a connection conduit that is separate from the extraction channel. The buffer chamber may be fluidly connected to the extraction passageway at a plurality of locations along the length of the extraction passageway.

At least a part of the surface of the buffer chamber may be defined by a flexible membrane. The buffer chamber may have an opening that is in fluid communication with the atmosphere. The fluid extraction system may comprise a purging device fluidly connected to the buffer chamber. The purging device may be configured to provide a gas into the buffer chamber. The fluid extraction system may comprise a separation tank fluidly connected to the extraction channel. The separation tank may be configured to receive two-phase fluid flow from the extraction channel. The buffer chamber may be fluidly connected to the extraction channel at a location between an opening of the extraction channel through which the two phase fluid enters the extraction system and the separation tank.

The volume of the buffer chamber may be at least four times that of the extraction channel. The fluid extraction system may comprise a pump configured to reduce the pressure acting on the two-phase fluid flow so as to draw the two-phase fluid flow along the extraction channel. The buffer chamber may be configured to reduce a pressure fluctuation in the two-phase fluid.

The fluid extraction system may comprise a pressure regulator connected between the atmosphere and the fluid extraction system, the pressure regulator configured to allow gas from the atmosphere to pass therethrough so as to bring the fluid extraction system into fluid communication with the atmosphere. The pressure regulator may be connected between the atmosphere and the buffer chamber. The pressure regulator may be connected between the atmosphere and the extraction channel.

The pressure regulator may comprise a biasing mechanism configured to prevent gas from passing through the pressure regulator if the pressure difference either side of the pressure regulator is below a certain value.

In an embodiment there is provided a fluid handling system for an immersion lithographic apparatus comprising the fluid extraction system described herein.

In an embodiment there is provided an immersion lithographic apparatus comprising the fluid extraction system as described herein. The immersion lithographic apparatus may comprise a projection system. The fluid extraction system may be configured to remove fluid from a space between the final element of the projection system and a substrate and/or substrate table.

In an embodiment there is provided an immersion lithographic apparatus comprising: a support, a projection system and a fluid handling system. The support is constructed to support a patterning device that is capable of imparting a radiation beam with a pattern in its cross-section to form a patterned radiation beam. The substrate table is constructed to hold a substrate. The projection system is configured to project the patterned radiation beam onto a target portion of the substrate. The fluid handling system, which may be as described herein, is configured to provide an immersion liquid between the projection system and the substrate, or the substrate table, or both the substrate and the substrate table.

In an embodiment there is provided a method of reducing a pressure fluctuation of an immersion liquid in an immersion lithographic apparatus. The method comprises extracting and reducing. In the extracting, a two-phase fluid is extracted from a location in the immersion lithographic apparatus using a fluid extraction system. In the reducing, a pressure fluctuation in the two-phase fluid being extracted is reduced by using a buffer chamber of the fluid extraction system.

The immersion lithographic apparatus may comprise a projection system. The location from which the two-phase fluid is extracted may be a space between the final element of the projection system and a substrate, or a substrate table, or both the substrate and the substrate table. The fluid extraction system may extract a mixture of gas and immersion liquid.

In an embodiment there is provided a fluid extraction system to extract a two-phase fluid in a lithographic apparatus. The fluid extraction system comprises: an extraction channel, and a separation tank. The extraction channel is for two-phase fluid flow therethrough. The separation tank is fluidly connected to the extraction channel. The fluid separation tank is configured to receive the two-phase fluid flow from the extraction channel. At least a portion of a wall of the extraction channel and/or at least a portion of a wall of the separation tank comprises a flexible boundary portion configured to deform in response to a change in the pressure differential across it so as to reduce a fluctuation in pressure of the two-phase fluid in the fluid extraction system.

The flexible boundary portion may be a part of the boundary of the separation tank. The fluid extraction system may comprise a pump connected to the separation tank so as to reduce the pressure inside the separation tank to extract the two-phase fluid into the extraction channel.

The fluid extraction system may comprise a pressure control chamber. The pressure control chamber may have the flexible boundary portion as part of its boundary. The pressure control chamber may be configured to provide a controlled pressure differential across the flexible boundary portion. The pressure control chamber may be configured to provide a substantially zero pressure difference across the flexible boundary portion. The flexible boundary portion may form part of the separation tank. The pressure control chamber may be attached to the separation tank. The separation tank may be configured to separate the two-phase fluid flow into a liquid phase and a gas phase. The separation tank may be configured to output the liquid phase and the gas phase through different outlets. The lithographic apparatus may be an immersion lithographic apparatus comprising a projection system. The fluid extraction system may be configured to remove fluid from a space between the final element of the projection system and a substrate and/or substrate table.

In an embodiment there is provided a fluid handling system for an immersion lithographic apparatus comprising the fluid extraction system as described herein.

In an embodiment there is provided an immersion lithographic apparatus comprising: a support, a substrate table, a projection system, and a fluid handling system. The support is constructed to support a patterning device that is capable of imparting a radiation beam with a pattern in its cross-section to form a patterned radiation beam. The substrate table is constructed to hold a substrate. The projection system is configured to project the patterned radiation beam onto a target portion of the substrate. The fluid handling system, which is described herein, is configured to provide an immersion liquid between the projection system and the substrate, or the substrate table, or both the substrate and the substrate table.

In an embodiment there is provided a method of reducing a pressure fluctuation of an immersion liquid used in an immersion lithographic apparatus. The method comprises: extracting and reducing. In the extracting, a two-phase fluid is extracted from a location in the immersion lithographic apparatus using a fluid extraction system. In the reducing, a pressure fluctuation in the two-phase fluid is reduced by using a flexible boundary portion of the fluid extraction system. The flexible boundary portion is configured to change shape in response to a change in pressure differential across the flexible boundary portion.

The immersion lithographic apparatus may comprise a projection system. The location from which the two-phase fluid is extracted may be a space between the final element of the projection system and a substrate, or a substrate table, or both the substrate and the substrate table. The fluid extraction system may extract a mixture of gas and immersion liquid.

The descriptions above are intended to be illustrative, not limiting. Thus, it will be apparent to one skilled in the art that modifications may be made to the invention as described without departing from the scope of the claims set out below.

The invention claimed is:

1. A fluid extraction system to extract a two-phase fluid in a lithographic apparatus, the fluid extraction system comprising:
   an extraction channel for two-phase fluid flow therethrough; and
   a separation tank fluidly connected to the extraction channel, and configured to receive the two-phase fluid flow from the extraction channel,
   wherein at least a portion of a wall of the extraction channel and/or at least a portion of a wall of the separation tank comprises a flexible boundary portion configured to deform in response to a change in the pressure differential across it so as to reduce a fluctuation in pressure of the two-phase fluid in the fluid extraction system and wherein a side of the flexible boundary portion facing away from the two-phase fluid is at about atmosphere or lower.

2. The fluid extraction system of claim 1, wherein the flexible boundary portion is a part of the boundary of the separation tank.

3. A fluid handling system for an immersion lithographic apparatus comprising the fluid extraction system of claim 1.

4. An immersion lithographic apparatus comprising:
   a substrate table constructed to hold a substrate;
   a projection system configured to projected a patterned radiation beam onto a target portion of the substrate; and
   the fluid extraction system according to claim 3 configured to extract a two-phase fluid comprising an immersion liquid from between the projection system and the substrate, or the substrate table, or both the substrate and the substrate table.

5. The immersion lithographic apparatus of claim 4, comprising at least a portion of the wall of the extraction channel comprising the flexible boundary portion configured to deform in response to a change in the pressure differential across it so as to reduce a fluctuation in pressure of the two-phase fluid in the fluid extraction system.

6. The fluid extraction system of claim 1, comprising at least a portion of the wall of the extraction channel comprising the flexible boundary portion configured to deform in response to a change in the pressure differential across it so as to reduce a fluctuation in pressure of the two-phase fluid in the fluid extraction system.

7. The fluid extraction system of claim 1, wherein the flexible boundary portion forms at least part of a side of a pressure control chamber, the pressure control chamber being on a side of the flexible boundary portion opposite of the two-phase fluid, wherein the pressure control chamber comprises an opening connected, or connectable to, a low pressure source to reduce the pressure in the pressure control chamber.

8. The fluid extraction system of claim 1, wherein the flexible boundary portion forms at least part of a side of a pressure control chamber, the pressure control chamber being on a side of the flexible boundary portion opposite of the two-phase fluid, and further comprising a pressure control system configured to control or set the pressure within the pressure control chamber to be substantially the same as pressure inside the extraction channel and/or the separation tank.

9. The fluid extraction system of claim 1, wherein the flexible boundary portion is located away from where the liquid of the two-phase fluid predominantly flows or collects.

10. The fluid extraction system of claim 1, comprising a pressure control system configured to control or set the pressure within a pressure control chamber to be substantially the same as pressure inside the extraction channel and/or the separation tank.

11. A method of reducing a pressure fluctuation of an immersion liquid used in an immersion lithographic apparatus, the method comprising:
   extracting a two-phase fluid from a location in the immersion lithographic apparatus using a fluid extraction system; and
   reducing a pressure fluctuation in the two-phase fluid by using a flexible boundary portion of the fluid extraction system, the flexible boundary portion configured to change shape in response to a change in pressure differential across the flexible boundary portion and a side of the flexible boundary portion facing away from the two-phase fluid is at about atmosphere or lower.

12. The method of claim 11, wherein the fluid extraction system comprises a tank and an extraction channel, connecting the tank to the location, to extract the two-phase fluid, wherein the flexible boundary portion is at least a portion of a wall of the extraction channel.

13. The method of claim 11, wherein the flexible boundary portion forms at least part of a side of a pressure control chamber, the pressure control chamber being on a side of the flexible boundary portion opposite of the two-phase fluid, and the method further comprises reducing the pressure in the pressure control chamber using a low pressure source connected to the pressure control chamber.

14. The method of claim 11, wherein the flexible boundary portion forms at least part of a side of a pressure control chamber, the pressure control chamber being on a side of the flexible boundary portion opposite of the two-phase fluid, and the method further comprises controlling or setting the pressure within the pressure control chamber to be substantially the same as the pressure inside the extraction channel and/or separation tank.

15. An immersion lithographic apparatus comprising:
   a substrate table constructed to hold a substrate;
   a projection system configured to projected a patterned radiation beam onto a target portion of the substrate; and
   a fluid extraction system configured to extract a two-phase fluid comprising an immersion liquid, the fluid extraction system comprising an extraction channel for two-phase fluid flow therethrough toward a tank or drain, wherein at least a portion of a wall of the extraction channel comprises a flexible boundary portion configured to deform in response to a change in the pressure differential across it so as to reduce a fluctuation in pressure of the two-phase fluid in the fluid extraction system and wherein a side of the flexible boundary portion facing away from the two-phase fluid is at about atmosphere or lower.

16. The immersion lithographic apparatus of claim 15, wherein the flexible boundary portion forms at least part of a side of a pressure control chamber, the pressure control chamber being on a side of the flexible boundary portion opposite of the two-phase fluid, wherein the pressure control chamber comprises an opening connected, or connectable to, a low pressure source to reduce the pressure in the pressure control chamber.

17. The immersion lithographic apparatus of claim 15, wherein the flexible boundary portion forms at least part of a side of a pressure control chamber, the pressure control chamber being on a side of the flexible boundary portion opposite of the two-phase fluid, and further comprising a pressure control system configured to control or set the pressure within the pressure control chamber to be substantially the same as pressure inside the extraction channel and/or the separation tank.

18. A fluid extraction system to extract a two-phase fluid in a lithographic apparatus, the fluid extraction system comprising:
   an extraction channel for two-phase fluid flow therethrough; and
   a separation tank fluidly connected to the extraction channel, and configured to receive the two-phase fluid flow from the extraction channel,
   wherein at least a portion of a wall of the extraction channel and/or at least a portion of a wall of the separation tank comprises a flexible boundary portion configured to deform in response to a change in the pressure differential across it so as to reduce a fluctuation in pressure of the two-phase fluid in the fluid extraction system,
   wherein the flexible boundary portion forms at least part of a side of a pressure control chamber, the pressure control chamber being on a side of the flexible boundary portion opposite of the two-phase fluid, and
   wherein (i) the pressure control chamber comprises an opening connected, or connectable to, a low pressure source to reduce the pressure in the pressure control chamber, or (ii) the fluid extraction system further comprising a pressure control system configured to control or set the pressure within the pressure control chamber to be substantially the same as pressure inside the extraction channel and/or the separation tank, or (iii) both (i) and (ii).

19. The fluid extraction system of claim 18, comprising the opening connected, or connectable to, a low pressure source to reduce the pressure in the pressure control chamber.

20. An immersion lithographic apparatus comprising:
   a substrate table constructed to hold a substrate;
   a projection system configured to projected a patterned radiation beam onto a target portion of the substrate; and the fluid extraction system according to claim 18 configured to extract a two-phase fluid comprising an immersion liquid from between the projection system and the substrate, or the substrate table, or both the substrate and the substrate table.

* * * * *